United States Patent
Morris, Jr. et al.

(10) Patent No.: US 6,630,994 B2
(45) Date of Patent: *Oct. 7, 2003

(54) TRANSMISSION DETECTION FOR A LASER POWER MONITOR AND SYSTEM

(75) Inventors: James E. Morris, Jr., Charlotte, NC (US); Michael R. Feldman, Charlotte, NC (US); Hongtao Han, Mooresville, NC (US)

(73) Assignee: Digital OPtics Corp., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/238,576

(22) Filed: Sep. 11, 2002

(65) Prior Publication Data

US 2003/0007144 A1 Jan. 9, 2003

Related U.S. Application Data

(63) Continuation of application No. 09/548,018, filed on Apr. 12, 2000, now Pat. No. 6,452,669.

(51) Int. Cl.$^7$ .................................................. G01J 1/46
(52) U.S. Cl. ............................ 356/215; 372/50; 372/96; 372/43; 385/48
(58) Field of Search ................................ 356/215, 218, 356/273; 372/50, 43, 96, 29, 45, 46, 99, 92, 31, 33; 250/211; 369/116; 437/209; 385/48, 49, 88; 438/460, 239; 156/250

(56) References Cited

U.S. PATENT DOCUMENTS

| | | | |
|---|---|---|---|
| 5,757,836 A | 5/1998 | Jiang et al. | |
| 5,774,486 A | 6/1998 | Jiang et al. | |
| 5,892,786 A | 4/1999 | Lott | |
| 5,953,355 A | 9/1999 | Kiely et al. | |
| 6,037,644 A | 3/2000 | Daghihgian et al. | |
| 6,069,905 A | 5/2000 | Davis et al. | |
| 6,314,223 B1 * | 11/2001 | Te Kolste et al. | 385/48 |
| 6,452,669 B1 * | 9/2002 | Morris et al. | 356/215 |

* cited by examiner

*Primary Examiner*—Hoa Q. Pham
(74) *Attorney, Agent, or Firm*—Susan S. Morse

(57) ABSTRACT

A power monitor for a light emitter uses an absorptive material placed in the path of the application beam. The absorptive has a measurable characteristics thereof altered by an intensity of the light beam, the absorptive material being thin enough to allow a portion of the light beam sufficient for a desired application to be passed to the desired application. Preferably, an anti-reflective coating is placed between the absorptive material and the light emitting device. The absorptive material may be formed directly on the light emitting device or may be formed on or integrated with a spacer.

21 Claims, 2 Drawing Sheets

TRANSMISSION DETECTION FOR A LASER POWER MONITOR AND SYSTEM

CROSS-REFERENCES TO RELATED APPLICATIONS

The present application claims is a continuation of U.S. Application Ser. No. 09/548,018 filed Apr. 12, 2000, now U.S. Pat. No. 6,452,669, the entire contents of which are hereby incorporated by reference for all purposes. The present application is also related to U.S. Application Ser. No. 09/386,280 filed on Aug. 31, 1999, now U.S. Pat. No. 6,314,223.

BACKGROUND OF THE INVENTION

1. Field of the Invention

The present invention is directed to monitoring power of a light emitting device, specifically for a power monitor in the same optical path as the primary beam.

2. Description of Related Art

Light emitting devices such as VCSELs need some form of power control to maintain a constant output. Such control is typically automatically performed by measuring a portion of an output of a light emitting device during operation and using this measurement to control the power supplied to the light emitting device.

Such control typically is achieved when the light emitting device to be controlled is an edge emitting laser because edge emitting lasers output light from two ends thereof. Thus, one output may be used for the desired application, while the other output may be used for the power control.

In contrast, a VCSEL typically only emits light from one surface. Hence, any monitoring of the light must be from the same output as used for the desired application of the VCSEL. VCSELs have lower manufacturing costs and their surface emissions make them easier to integrate with other optical devices than the edge emitting lasers, so the use of VCSELs is very desirable.

Previous attempts to monitor the power of VCSELS typically involve splitting off of a portion of the output beam to use as a monitor beam. Examples of such configurations are disclosed in U.S. Pat. Nos. 5,757,836 and 5,774,486. However, such splitting off obscures part of the beam which may affect the wavefront and imaging, and hence coupling, of the light. Further, if the intensity distribution changes, such as when there is a change in lasing mode, the monitored power may change in a way which does not represent the overall output power of the VCSEL.

Additionally, splitting off of the beam may require the output of the VCSEL to be increased in order to maintain the requisite power level while allowing detection. Previous uses of scattering the beam to create a monitor beam relied on reflection for directing the beam and did not provide an optimal signal to the monitor detector. Further, previous scattering did not insure the entire beam was being monitored.

In the commonly assigned, co-pending related application, U.S. Application Ser. No. 09/386,280, a diffractive was used to effectively monitor an entire beam output by a VCSEL. However, this configuration still requires space for the detector, an additional optical element for the diffraction and alignment of the diffractive element and the detector.

SUMMARY OF THE INVENTION

The present invention is therefore directed to power monitoring which substantially overcomes one or more of the problems due to the limitations and disadvantages of the related art.

These and other objects may be realized by monitoring power from a monitor beam which is coextensive with a light beam to be used in an application. Such monitoring may be performed using a photodiode to detect the beam, without requiring a portion of the light beam to take a different path than the remainder of the light beam.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which.

DETAILED DESCRIPTION OF THE PREFERRED EMBODIMENTS

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation.

Figure 1:
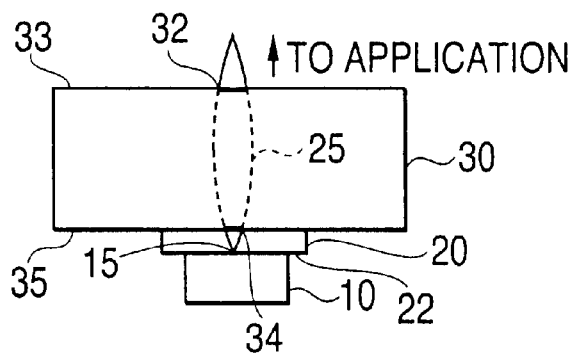
FIG. 1 is a side view of an embodiment of the present invention including a detector for monitoring power of an application beam by a VCSEL.

A configuration for monitoring power of an entire beam without deflecting the beam is shown in FIG. 1. A light emitting device 10, e.g., a VCSEL or a light emitting diode, emits a light beam 15 to be used in a desired application. The light beam 15 impinges upon a photodetector 20, preferably a photodiode. The photodiode absorbs part of the beam output by the VCSEL. The amount of absorption depends on the wavelength of the light, the ambient temperature, the material used for the photodiode and the thickness of the photodiode. For example, when the photodiode is made of silicon and has a thickness of 5 microns, at room temperature, 40% of light having a wavelength of 850 nm will be absorbed.

The light 25 which is not absorbed by the photodiode 20 continues on to the desired application. This transmission may be through an optics block 30 having optics 32, 34 on a top surface 33 and/or on a bottom surface 35. These optics may be a reflective element, a refractive element, a diffractive element, a hybrid element, or any combination thereof.

The photodiode may have either a lateral configuration, in which the p-, i- and n-regions thereof are arranged horizontally to one another, or a vertical configuration in which the p-, i- and n-regions thereof are stacked on top of one another. In either configuration, a reverse-biased fixed voltage is applied to a resistor which is connected to either the p- or n-region resulting in a photocurrent, which varies with the intensity of the light, measures the power output by the VCSEL.

In addition to being transmitted to the desired application, due to the interface, i.e., difference in refractive index, between the photodiode and the VCSEL and/or between the photodiode and air or adjoining element, such as the optics block, some of the light 25 will be reflected back into the VCSEL. The back reflection is undesirable and affects the performance of the VCSEL. Therefore, an anti-reflective coating 22 may be provided on the bottom of the photodiode to prevent any light from being reflected back towards the VCSEL.

In any of the configurations set forth herein, the photodiode may be formed on the VCSEL itself, may be formed, i.e., deposited, on a surface, or may be directly integrated with another part of the system. While the photodiode is illustrated with a certain thickness in the Figures, this thickness is for ease of viewing only. The photodiode itself is very thin and is formed directly, i.e., deposited, on a surface. While the photodiode can be formed on the VCSEL itself, it is usually preferable not to place the photodiode here, but on the substrate. VCSELs are very sensitive and performing additional manufacturing on them may reduce the yield. Further, placing a photodiode on the VCSEL may introduce additional stress on the VCSEL due to differences between the material of the photodiode and the material of the VCSEL.

Figure 2:
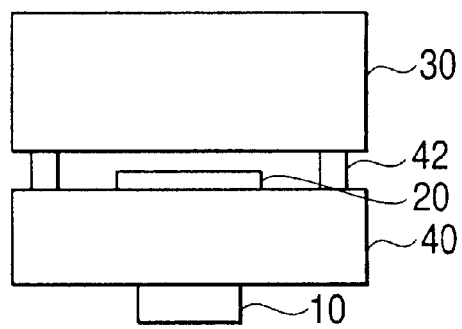
FIG. 2 is a side view of another embodiment of the present invention including a spacing element between the detector and the VCSEL.

An alternative configuration is shown in FIG. 2, in which the VCSEL 10 is provided on one side of a block 40 of a material, e.g., silicon, sapphire, diamond, with the power monitor 20 being positioned on the other side of the block 40. The separation of the power monitor 20 and the VCSEL 10 aids in reducing back reflection when the block 40 includes anti-reflective coatings. The surface of the block 40 containing the power monitor 20 is bonded to the optics block 30 with bonding material 42 being roughly the thickness of the power monitor 20. If the block 40 is a good thermal conductor, i.e., acts as a heat sink, such as silicon, this configuration could enhance thermal performance of the system. However, even when the wavelengths of interest do not allow a block which is a good thermal conductor to be used, the improved reduction in back reflections from the separation between the VCSEL and the power monitor is still useful. Improved thermal performance may still be realized from mounting a heat sink on the bottom of the VCSEL.

Figure 3:
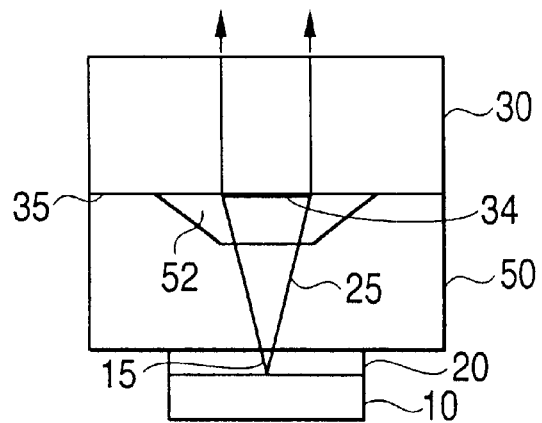
FIG. 3 is a side view of another embodiment of the present invention including a spacing element between the detector and the optics block.

Another embodiment which can be used if a material which acts as a heat sink for the VCSEL, but is not too absorptive for the wavelengths output by the VCSEL, is shown in FIG. 3. Here, the power monitor is mounted directly on the VCSEL as in FIG. 1, but a spacer block is now interspersed between the power monitor and the optics block. This configuration is particularly useful if the optics block and the spacer block are made of the same material and there is to be an optical element placed on a bottom surface of the optics block. This configuration allows an air gap to be provided between the submount block and the optical element so that the optical element will be apparent to the light traveling therethrough. This gap also allows the beam to spread out, which may be of particular importance if the blocks have a high index of refraction. Alternatively or additionally, some index matching material may be provided in the gap to reduce back reflections.

When a configuration like that in FIG. 3 is needed for a wavelength at which the material to be used as a spacer is too strongly absorptive, the air gap may be made larger, while providing a small surface of the spacer which will have an anti-reflective coating thereon.

Figure 4A:
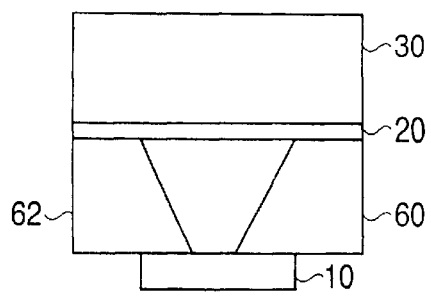
FIGS. 4a–4c are side views of other embodiments of the present invention including a spacing element between the detector and the VCSEL.
Figure 4B:
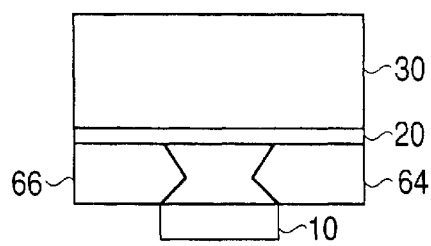
Figure 4C:
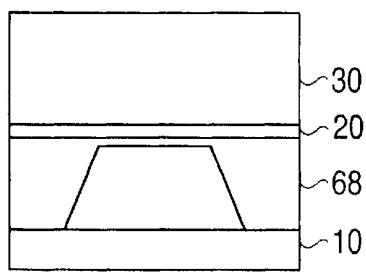

When spacers are used to space the VCSEL and the power monitor, a number of different configurations can be employed. This separation aids in reducing the back reflection into the VCSEL. This separation also allows the light to expand to a larger size when it strikes the photodetector, reducing the light intensity, thereby increasing photodetector performance for high power applications, e.g., avoiding saturation of the photodetector. Examples of these various configurations are shown in FIGS. 4a–4c. In FIG. 4a, a spacer element includes two passage therein having single sided wedges 60, 62; in FIG. 4b, a spacer element includes a passage therein having double sided wedges 64, 66; and in FIG. 4c, a spacer element includes a passage which does not go all the way through the spacer element 68, thereby allowing the photodiode 20 to be deposited on or integrated with the spacer element 68. While the spacer elements herein have been illustrated as being separate elements, any of the configurations could be integrated with a substrate on which the light source 10 is mounted or with a substrate on which the photodiode is formed or deposited.

Figure 5:
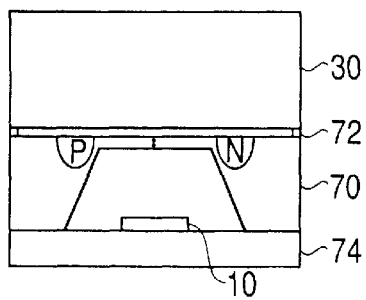
FIG. 5 is a side view of another embodiment of the present invention in which the power monitor is integrated into the spacer.

FIG. 5 illustrates a method of integrating a lateral PIN photodiode as the power monitor into the spacer 70. Here, the spacer 70 must be made of an appropriate insulating material and then the p- and n-regions therein are created using ion implantation. The i-region, or intrinsic region, has no impurities implanted therein, but may in actuality have some present, depending on the carrier density of the material itself. Such ion implantation may be used with any configurations having a spacer extending across the beam path, such as shown in FIGS. 3 and 4. In any of the above configurations, the VCSEL may be mounted on a submount 74 as shown in FIG. 5 to improve the thermal properties thereof. Further, while the details of the bonding material 72 are shown in FIG. 5, the mounting of the spacer block 70 and the optics block 30 are the same as for the other configurations.

Any of the above configurations may be formed by wafer-to-wafer bonding the block elements after depositing or integrating the photodiode and mounting the VCSEL, as set forth, for example, U.S. Pat. No. 6,096,155. Further, the photodiode may be deposited on or integrated with the element onto which it is to be provided on a wafer level. Finally, while cross-sections of the spacer elements have been shown, it is to be understood that these spacer elements having through passages therein may actually enclose this passage, with the passages preferably being formed on a wafer level.

Although preferred embodiments of the present invention have been described in detail herein above, it should be clearly understood that many variations and/or modifications of the basic inventive concepts taught herein, which may appear to those skilled in the art, will still fall within the spirit and scope of the present invention as defined in the appended claims and their equivalents.

What is claimed is:

1. A power monitor for monitoring power of a light emitting device outputting a light beam, the power monitor comprising, an absorptive material placed in an application path of the light beam, the absorptive material having a measurable characteristics thereof altered by an intensity of the light beam, the absorptive material being thin enough to allow a portion of the light beam sufficient for a desired application to be passed to the desired application;

a spacer between the light emitting device and the absorptive material; and an optics block having a focusing element on a surface thereof, the optics block and the spacer being bonded together.

2. The power monitor of claim 1, wherein the absorptive material is doped to form a PIN photodiode.

3. The power monitor of claim 2, wherein regions of the PIN photodiode are laterally configured.

4. The power monitor of claim 2, wherein regions of the PIN photodiode are vertically configured.

5. The power monitor of claim 1, wherein the absorptive material is formed on the spacer.

6. The power monitor of claim 1, wherein the spacer comprises the absorptive material.

7. The power monitor of claim 6, wherein the spacer is doped with ions to form a PIN photodiode.

8. The power monitor of claim 7, wherein the ions are implanted in the spacer to form a PIN photodiode.

9. The power monitor of claim 1, further comprising an anti-reflective coating between the absorptive material and the light emitting device.

10. An integrated power monitor and optical system comprising:

an absorptive material placed in an application path of a light beam, the absorptive material having a measurable characteristics thereof altered by an intensity of the light beam, the absorptive material being thin enough to allow a portion of the light beam sufficient for a desired application to be passed to the desired application; and an optics block having a focusing element thereon, the absorptive material and the optics block being integrated at a wafer level.

11. The system of claim 10, wherein the absorptive material is doped to form a PIN photodiode.

12. The system of claim 11, wherein regions of the PIN photodiode are laterally configured.

13. The system of claim 11, wherein regions of the PIN photodiode are vertically configured.

14. The system of claim 10, wherein the absorptive material is deposited directly on a light source providing the light beam.

15. The system of claim 10, further comprising a substrate on which a light source providing the light beam is mounted and wherein the absorptive material is deposited on the substrate on a surface opposite to the light source.

16. The system of claim 15, wherein the substrate serves as a heat sink for the light source.

17. The system of claim 10, further comprising a spacer between the light source and the desired application.

18. The system of claim 17, wherein the absorptive material is formed on the spacer.

19. The system of claim 17, wherein the spacer comprises the absorptive material.

20. The system of claim 19, wherein the spacer is doped with ions to form a PIN photodiode.

21. The system of claim 10, further comprising an anti-reflective coating between the absorptive material and the light emitting device.

* * * * *